United States Patent [19]
Seki et al.

[11] 3,942,128
[45] Mar. 2, 1976

[54] CONSTANT-VOLTAGE CIRCUIT

[75] Inventors: Kunio Seki, Kodaira; Ryozo Kontani, Hino, both of Japan

[73] Assignee: Hitachi, Ltd., Japan

[22] Filed: Oct. 4, 1973

[21] Appl. No.: 403,405

[30] Foreign Application Priority Data
Oct. 4, 1972   Japan.............................. 47-99011

[52] U.S. Cl. ..................... 330/22; 307/297; 330/15; 330/19; 330/40
[51] Int. Cl.² ............................................ H03F 3/04
[58] Field of Search .......... 307/297; 330/13, 15, 17, 330/19, 22, 40

[56] References Cited
UNITED STATES PATENTS 3,648,153   3/1972   Graf................................... 307/297
3,766,410   10/1973   Eisaesser............................ 330/15

*Primary Examiner*—R. V. Rolinec
*Assistant Examiner*—Lawrence J. Dahl
*Attorney, Agent, or Firm*—Craig & Antonelli

[57] ABSTRACT

A constant-voltage circuit includes a transistor, a resistance connected on the input side of the transistor, a compensating diode connected on the output side of the transistor, and a non-linear bias portion connected in series with the resistance, whereby fluctuations in the base-emitter voltage of the transistor are compensated for by the compensating diode.

15 Claims, 7 Drawing Figures

CONSTANT-VOLTAGE CIRCUIT

BACKGROUND OF THE INVENTION

The present invention relates to a constant-voltage circuit.

In, for example, the push-pull output circuit of an acoustic power amplifier, in order to correct for distortion due to a curve in the $V_{BE} - I_C$ characteristic of a transistor, the circuit is designed to cause an idling current to flow so that the output transistor may be operated in the linear region of the $V_{BE} - I_C$ characteristic.

The base-emitter voltage $V_{BE}$ of the transistor, however, changes at the rate of approximately $-2.3$ mV/°C for temperature changes. For this reason, the idling current is also changed largely by temperature changes. When the idling current decreases, a crossover distortion arises. Conversely, when the idling current increases, the efficiency lowers and a thermal runaway takes place. Thereefore, a variety of constant-voltage (or constant-current) circuits have been developed which normally prevent the idling current from changing in response to voltage fluctuations. These circuits have, however, demerits along with their merits. For example, a known circuit of a certain type provides for a gradual increase in the idling current as the supply voltage arises. With another circuit, although the idling current is held constant for supply voltages in a specified range, the idling current decreases for supply voltages which are too high.

SUMMARY OF THE INVENTION

It is therefore the principal object of the present invention to provide a constant-voltage circuit which is extraordinarily stable with respect to supply voltage changes.

Another object of the present invention is to provide a constant-voltage circuit which provides substantially no fluctuations even for the dispersion in the manufacture of integrated circuits.

Still another object of the present invention is to provide a constant-voltage circuit which is the most suitable for rendering constant the idling current of the push-pull output circuit of a power amplifier.

In order to accomplish such objects, the present invention consists of a constant-voltage circuit in which a resistance is connected on the input side of a transistor, a non-linear bias portion is connected in series with the resistance, and a compensating diode is connected on the output side of the transistor, whereby fluctuations in the base-emitter voltage of the transistor are compensated for by the compensating diode.

PREFERRED EMBODIMENTS OF THE INVENTION

Figure 1:
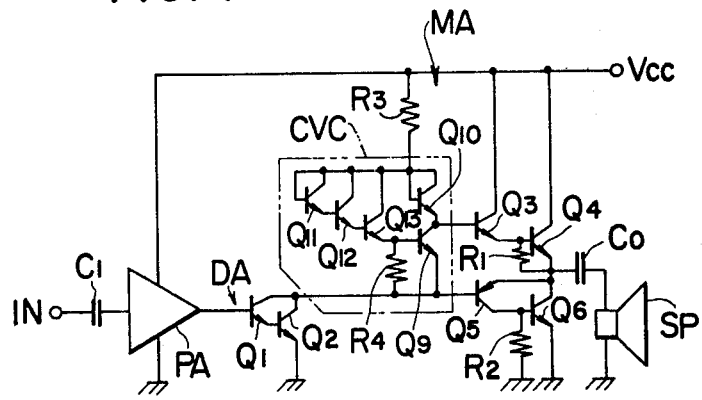
FIG. 1 is a schematic circuit diagram showing an embodiment of the constant-voltage circuit according to the present invention.

FIG. 1 shows an embodiment of the constant-voltage circuit according to the present invention, which is particularly applied to an acoustic power amplifier. Referring to the figure, PA designates a pre-amplifier portion, DA a driver circuit, MA a power amplifier portion, SP a speaker, IN an input terminal, $V_{cc}$ a power supply terminal, and $C_i$ and $C_o$ capacitors. In this case, the driver circuit DA is composed of N-P-N transistors $Q_1$ and $Q_2$ which are in the Darlington connection.

The power amplifier portion MA is composed of N-P-N transistors $Q_3$ and $Q_4$ and a P-N-P transistor $Q_5$ and an N-P-N transistor $Q_6$ which are in the complementary push-pull connection, resistances $R_1$ and $R_2$ which are respectively connected between the base and emitter of the N-P-N transistor $Q_4$ and between those of the N-P-N transistor $Q_6$, a constant-voltage circuit CVC for supplying an idling current, and a resistance $R_3$.

Further, the constant-voltage circuit CVC is composed of N-P-N transistors $Q_9 - Q_{13}$ and a resistance $R_4$. The collector of the transistor $Q_9$ is connected to the emitter of the transistor $Q_{10}$. The resistance $R_4$ is connected between the base and emitter of the transistor $Q_9$. The transistor $Q_{10}$ has its base and collector short-circuited, and is used as a compensating diode. The transistors $Q_{11}$, $Q_{12}$ and $Q_{13}$ are in the Darlington connection. The base of the transistor $Q_{11}$ is connected, along with the collector of its own transistor and the collectors of the other transistors $Q_{12}$ and $Q_{13}$, to the collector of the transistor $Q_{10}$. The emitter of the transistor $Q_{13}$ is connected to the base of the transistor $Q_9$.

The collector of the transistor $Q_{10}$ of the constant-voltage circuit CVC is connected through the resistance $R_3$ to the power supply terminal $V_{cc}$, while the emitter of the transistor $Q_9$ is connected to the base of the transistor $Q_5$ and to the collector of the transistor $Q_2$ constituting the driver circuit DA.

With such a construction for the constant-voltage circuit, the following equation holds:

Letting $V_0$ be the collector-emitter voltage of the transistor $Q_9$ serving as the output voltage of the constant-voltage circuit CVC, $V_{F1} - V_{F4}$ be the forward voltages of the transistors $Q_{10} - Q_{13}$ constituting diodes, respectively, $I_C$ be the collector current of the transistor $Q_9$, and $V_{BE}$ be the base-emitter voltage of the transistor $Q_9$, $$V_0 = V_{F2} + V_{F3} + V_{F4} + V_{BE}(I_C) - V_{F1}(I_C)$$

In this case, since the $V_{BE} - I_C$ characteristic of the transistor $Q_9$ is steep, the voltage $V_{BE}$ of this transistor is substantially constant. Accordingly, currents flowing through the transistors $Q_{11} - Q_{13}$ are rendered substantially constant. Besides, the $V_F - I_C$ characteristics of the transistors $Q_{11} - Q_{13}$ are steep. Therefore, the forward voltages $V_{F2}$, $V_{F3}$ and $V_{F4}$ of these transistors $Q_{11}$, $Q_{12}$ and $Q_{13}$ hardly change and become constant in regard to fluctuations in the supply voltage.

Figure 2:
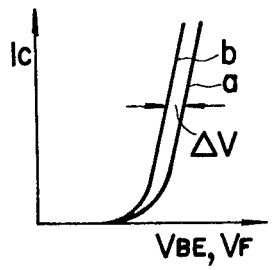
FIG. 2 is a characteristic diagram for explaining the operation of the embodiment in FIG. 1.

In the constant-voltage circuit CVC, the resistance $R_4$ functions to make substantially constant the currents flowing through the transistors $Q_{11} - Q_{13}$. When the supply voltage increases, the collector current $I_C$ of the transistor $Q_9$ increases. Therewith, the base-emitter voltage $V_{BE}$ of the transistor $Q_9$ increases. Further, the forward voltage $V_{F1}$ of the transistor $Q_{10}$ increases. In consequence, the output of the constant-voltage circuit is maintained constant. More concretely, the $V_{BE} - I_C$ characteristic of the transistor $Q_9$ and the $V_F - I_C$ characteristic of the transistor $Q_{10}$ are shown by curves $a$ and b in FIG. 2, respectively. As seen in the figure, the variation $\Delta V$ between the voltage $V_{BE}$ of the transistor $Q_9$ and the voltage $V_F$ of the transistor $Q_{10}$ is constant. For this reason, even when there is any fluctuation due to the $V_{BE} - I_C$ characteristic, the collector-emitter voltage of the transistor $Q_9$ or the output voltage $V_0$ has the component of the fluctuation compensated for substantially perfectly by the $V_F - I_C$ characteristic of the transistor $Q_{10}$. Thus, it is possible to obtain the output voltage $V_0$ stabilized to the changes of the supply voltage.

Accordingly, if the constant voltage output $V_0$ is used, as in the described embodiment, as the bias for the transistors $Q_3 - Q_6$ arranged in the complementary push-pull connection, there can be obtained an idling current which is constant irrespective of changes in the supply voltage.

In addition, with such a construction, the non-uniformity of bias voltages is small as compared with that in prior-art circuits in which biases based on resistance ratios are exerted on transistors. Accordingly, when the circuit of the embodiment is applied to an integrated circuit, the dispersion diminishes and the yield can be enhanced.

Figure 3:
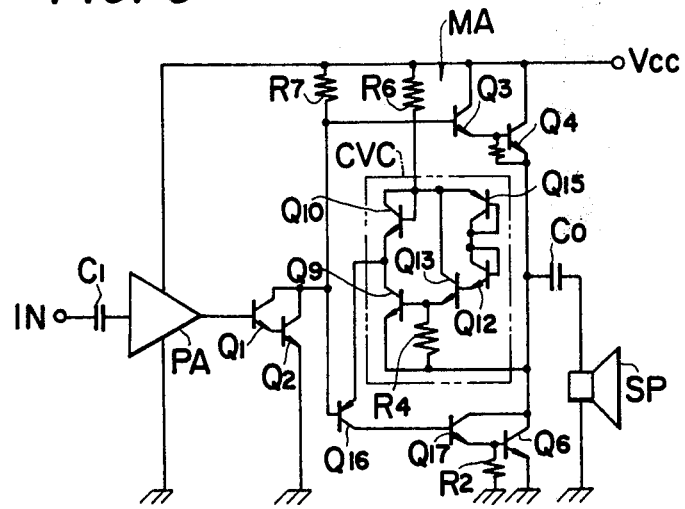
FIGS. 3 to 7 are schematic circuit diagrams each showing another embodiment of the constant-voltage circuit according to the present invention.
Figure 4:
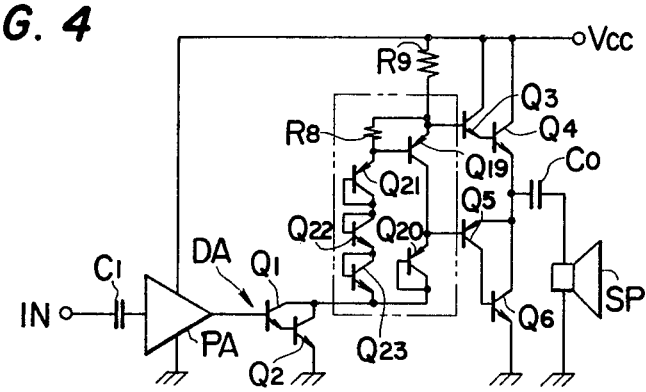
Figure 5:
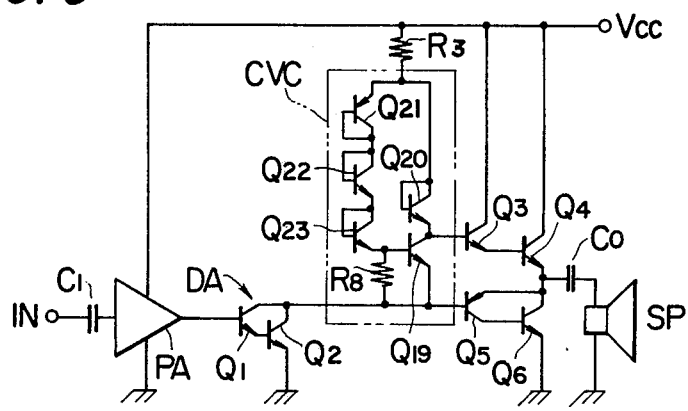

FIGS. 3 to 5 illustrate further embodiments of the constant-voltage circuit according to the present invention. All these embodiments are applied to the acoustic power amplifier as described in FIG. 1. Referring first to FIG. 3, the constant-voltage circuit CVC is constructed such that the base of the transistor $Q_{12}$ is connected to the collector thereof, and that the collector and emitter of a P-N-P transistor $Q_{15}$ are respectively connected to the collector of the transistor $Q_{12}$ and the collector of the transistor $Q_{10}$. The remaining construction is similar to that in FIG. 1. Also with such a construction, a constant voltage output can be provided between the collector and the base of transistor $Q_9$.

The collector of the transistor $Q_{10}$ of the constant-voltage circuit CVC is connected through a resistance $R_6$ to the power supply terminal $V_{CC}$. The emitter of the transistor $Q_9$ is connected to the juncture between the transistors $Q_4$ and $Q_6$. The collector of the transistor $Q_9$ is connected to the emitter of the transistor $Q_{16}$.

The base of the transistor $Q_{16}$ is connected to the collector of the transistor $Q_2$, and is also connected through a resistance $R_7$ to the power supply terminal $V_{CC}$. The collector of the transistor $Q_{16}$ is connected to the base of an N-P-N transistor $Q_{17}$. The base of the transistor $Q_3$ is connected to the collector of the transistor $Q_2$. The transistor $Q_{17}$ forms a Darlington connection with the transistor $Q_6$.

Also with such a construction, the forward voltages of the transistors $Q_{15}$, $Q_{12}$ and $Q_{13}$ are maintained constant against changes in the supply voltage. Accordingly, as in the case of FIG. 1, even when the supply voltage fluctuates, the increase in the voltage $V_{BE}$ of the transistor $Q_9$ as is ascribable to the fluctuation can be compensated for by the forward voltage of the transistor $Q_{10}$.

Referring now to FIG. 4, the constant-voltage circuit CVC is constituted of P-N-P transistors $Q_{19} - Q_{21}$, N-P-N transistors $Q_{22}$ and $Q_{23}$, and a resistance $R_8$. The collector of the transistor $Q_{19}$ is connected to the emitter of the transistor $Q_{20}$. The resistance $R_8$ is connected between the base and emitter of the transistor $Q_{19}$. The transistor $Q_{20}$ has its base and collector short-circuited and is employed as a diode. The transistors $Q_{21}$, $Q_{22}$ and $Q_{23}$ are in a series diode connection. The emitter of the transistor $Q_{21}$ is connected to the base of the transistor $Q_{19}$, while the emitter of the transistor $Q_{23}$ is connected to the collector of the transistor $Q_{20}$.

The emitter of the transistor $Q_{19}$ is connected through a resistance $R_9$ to the power supply terminal $V_{CC}$. The collector of the transistor $Q_{20}$ is connected to the collector of the transistor $Q_2$ constituting the driver circuit DA. The collector of the transistor $Q_{19}$ is connected to the base of the transistor $Q_5$.

Referring next to FIG. 5, the constant-voltage circuit CVC is constructed by reversing the connection of the constant-voltage circuit in FIG. 4. In this case, an N-P-N transistor is employed as the transistor $Q_{20}$. Also with such a construction, similarly to the case of FIG. 1, the fluctuation of the base-emitter voltage of the transistor $Q_{19}$ can be compensated for by the forward voltage of the transistor $Q_{20}$, and a constant voltage output stable to a temperature change can be produced.

Figure 6:
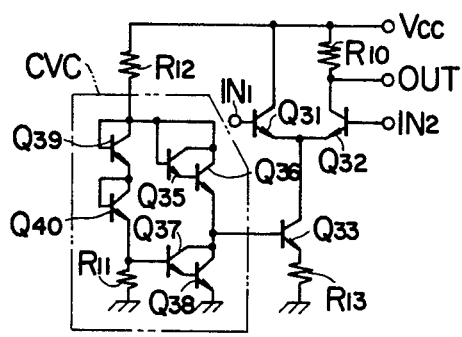
Figure 7:
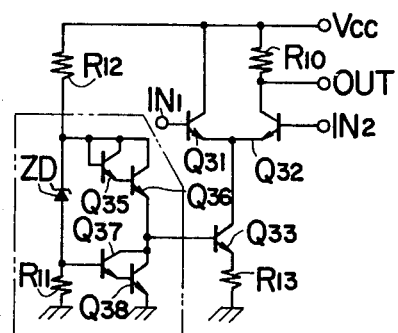

FIGS. 6 and 7 show still further embodiments of the constant-voltage circuit according to the present invention. These embodiments are directed to the biasing of the constant-current transistor of a differential amplifier circuit. Referring to FIG. 6, transistors $Q_{31}$ and $Q_{32}$ are emitter-coupled, the collector of the transistor $Q_{31}$ is directly connected to the power supply terminal $V_{CC}$, and the collector of the transistor $Q_{32}$ is connected through a load $R_{10}$ to the power supply terminal $V_{CC}$. The collector of a transistor $Q_{33}$ is connected to the emitters of the transistors $Q_{31}$ and $Q_{32}$, while the emitter of the transistor $Q_{33}$ is grounded through a resistance $R_{13}$.

The constant-voltage circuit employed herein is composed of transistors $Q_{35}$ and $Q_{36}$ and transistors $Q_{37}$ and $Q_{38}$ respectively being in the Darlington connection, transistors $Q_{39}$ and $Q_{40}$ being in the diode connection, and a resistance $R_{11}$. The collector of the transistor $Q_{38}$ is connected to the emitter of the transistor $Q_{36}$, while the juncture between them is connected to the base of the transistor $Q_{33}$. The emitter of the transistor $Q_{38}$ is grounded. Along with the base of the transistor $Q_{37}$, the emitter of the transistor $Q_{40}$ is grounded through the resistance $R_{11}$. Further, along with the collector of the transistor $Q_{35}$, the collector of the transistor $Q_{39}$ is connected through a resistance $R_{12}$ to the power supply terminal $V_{CC}$. In the differential amplifier, $IN_1$ and $IN_2$ indicate input terminals, and OUT indicates an output terminal.

In the case of FIG. 7, a Zener diode ZD is employed instead of the transistors $Q_{39}$ and $Q_{40}$ in FIG. 6.

In the embodiments in FIGS. 6 and 7, the transistors $Q_{37}$ and $Q_{38}$ (corresponding to the transistor $Q_9$ in FIG. 1) are arranged in a Darlington connection. In the case of this construction, the transistors $Q_{35}$ and $Q_{36}$ having the function of the compensating diode are also arranged in a Darlington connection. The transistors $Q_{35}$ and $Q_{36}$ may be arranged in a series diode connection.

In the foregoing embodiments, the respective non-linear bias portions of the transistor $Q_9$, transistor $Q_{19}$ and transistors $Q_{37}$ and $Q_{38}$ are constituted of the transistors $Q_{11}$, $Q_{12}$ and $Q_{13}$ (or transistors $Q_{15}$, $Q_{12}$ and $Q_{13}$), transistors $Q_{21}$, $Q_{22}$ and $Q_{23}$ and transistors $Q_{39}$ and $Q_{40}$ (or Zener diode ZD). The constituent elements, however, are not restrictive, but any element having a threshold voltage $V_T$ and a dynamic resistance $R_s$ can be employed. With such an element, a non-linear bias portion whose output is substantially equal to the threshold voltage $V_T$ and whose dynamic resistance is lower than $R_s$ can be obtained.

As described above, by using the constant-voltage circuit according to the present invention, a constant voltage output which is very stable to temperature changes can be produced. Besides, in accordance with the present invention, the constant-voltage circuit exhibits little fluctuations even for the dispersion of integrated circuits in the manufacture thereof.

While we have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What is claimed is:

1. A constant-voltage circuit comprising a first transistor having input, output and control electrodes, a compensating diode having one end connected to said output electrode of said transistor, non-linear bias means connected between the other end of said compensating diode and said control electrode of said transistor for controlling the bias of said transistor, and a resistance means connected between said input and control electrodes of said first transistor for supplying a substantially constant current through said non-linear bias means, a constant voltage output being derived across said input and output electrodes of said transistor, wherein said non-linear bias means includes a second transistor having an output electrode connected to said other end of said diode, an input electrode connected to said control electrode of said first transistor and a control electrode, at least a pair of diodes connected in series between the output and control electrodes of said second transistor, and a voltage source connected to said other end of said diode.

2. A constant-voltage circuit as defined in claim 1, wherein three diodes are connected in series between the control electrode of said first transistor and said other end of said diode.

3. A constant-voltage circuit comprising a first transistor having input, output and control electrodes, a compensating diode having one end connected to said output electrode of said transistor, non-linear bias means connected between the other end of said compensating diode and said control electrode of said transistor for controlling the bias of said transistor, and a resistance means connected between said input and control electrodes of said first transistor for supplying a substantially constant current through said non-linear bias means, a constant voltage output being derived across said input and output electrodes of said transistor, wherein said non-linear bias means includes a second transistor having an output electrode connected to said other end of said diode, an input electrode connected to said control electrode of said first transistor and a control electrode, at least a pair of diodes connected in series between the output and control electrodes of said second transistor, and a voltage source connected to the input electrode of said first transistor.

4. A constant-voltage circuit as defined in claim 3, further including a second transistor interposed between one end of said resistance and the base of said first transistor.

5. A constant-voltage circuit as defined in claim 4, wherein said compensating diode is formed by a pair of additional transistors in the Darlington connection.

6. A constant-voltage circuit as defined in claim 4, wherein said non-linear bias means includes a pair of diodes connected in series between the other end of said compensating diode and the base of said first transistor, and a voltage source connected to said other end of said compensating diode.

7. A constant voltage circuit comprising a first transistor having input, output and control electrodes, a compensating diode having one end connected to said output electrode of said transistor, non-linear bias means connected between the other end of said compensating diode and said control electrode of said transistor for controlling the bias of said transistor, a resistance means connected between said input and control electrodes of said first transistor for supplying a substantially constant current through said non-linear bias means, a constant voltage output being derived across said input and output electrodes of said transistor, and a second transistor interposed between one end of said resistance means and the control electrode of said first transistor, wherein said non-linear bias means includes a Zener diode connected between the other end of said compensating diode and said control electrode of said first transistor, and a voltage source connected to said other end of said compensating diode.

8. In a power amplifier circuit including four transistors connected in first and second stages forming a complementary push-pull configuration, a constant voltage circuit connected to said pairs of transistors comprising a further transistor having input, output and control electrodes, a resistance element connected between said input and control electrodes of said further transistor, a compensating diode having one end connected to said output electrode of said further transistor, and non-linear bias means connected between the other end of said compensating diode and said control electrode of said further transistor for controlling the bias thereof, the input and output electrodes of said further transistor being connected to a respective one of said first and second stages to provide a constant voltage output thereto.

9. A constant-voltage circuit as defined in claim 8, wherein said non-linear bias means includes a plurality of additional transistors connected in the Darlington manner between said other end of said diode and said control electrode of said further transistor, and a voltage source connected to said other end of said diode.

10. A constant-voltage circuit as defined in claim 8, wherein said non-linear bias means includes an additional transistor having an output electrode connected to said other end of said diode, an input electrode connected to said control electrode of said further transistor and a control electrode, at least a pair of diodes connected in series between the output and control electrodes of said additional transistor, and a voltage source connected to said other end of said diode.

11. A constant-voltage circuit as defined in claim 8, wherein three diodes are connected in series between the control electrode of said further transistor and the other end of said compensating diode.

12. A constant-voltage circuit as defined in claim 8, wherein said non-linear bias means includes an additional transistor having an output electrode connected to said other end of said diode, an input electrode connected to said control electrode of said further transistor and a control electrode, at least a pair of diodes connected in series between the output and control electrodes of said additional transistor, and a voltage source connected to the input electrode of said further transistor.

13. A constant-voltage circuit comprising a first transistor having a collector, a base and an emitter; a forward-biased compensating diode having one end connected to said collector; a non-linear bias means connected between the other end of said diode and said base for supplying a substantially constant voltage therebetween; and a linear resistance connected between said base and said emitter.

14. A constant-voltage circuit as defined in claim 13, wherein said non-linear bias means includes a plurality of additional transistors connected in the Darlington manner between said other end of said diode and said base of said first transistor, and a voltage source connected to said other end of said diode.

15. A constant-voltage circuit as defined in claim 2, wherein said compensating diode comprises a further transistor having control and output electrodes connected together and an input electrode connected to the collector of said first transistor.

* * * * *